United States Patent [19]

Keel et al.

[11] 4,424,271
[45] Jan. 3, 1984

[54] DEPOSITION PROCESS

[75] Inventors: Beat G. Keel, Prior Lake; Tuan P. Tran, Bloomington; Mara M. Koller, St. Paul; Larry D. Zimmerman, Apple Valley; Patrick C. Darst, Cottage Grove, all of Minn.

[73] Assignee: Magnetic Peripherals Inc., Minnneapolis, Minn.

[21] Appl. No.: 418,352

[22] Filed: Sep. 15, 1982

[51] Int. Cl.³ .............................................. G03C 5/00
[52] U.S. Cl. .................................. 430/315; 427/259; 430/312; 430/319
[58] Field of Search ................... 427/259, 89, 93, 132; 430/312, 313, 315, 320, 319

[56] References Cited

U.S. PATENT DOCUMENTS 4,224,361  9/1980  Romankiw .......................... 427/259
4,238,559 12/1980  Feng et al. ...................... 427/273 X
4,256,816  3/1981  Dunkleberger ................. 427/282 X Primary Examiner—Evan K. Lawrence
Attorney, Agent, or Firm—R. M. Angus; J. A. Genovese

[57] ABSTRACT

A desired feature of deposition material is produced on a substrate by forming an adhesion inhibitor on the substrate in a pattern whose inner edges are adjacent the bounds of the feature being produced. A seedlayer is deposited over the adhesion inhibitor and exposed portions of the substrate, and a mask is formed over the seedlayer adjacent the edges of the adhesion inhibitor, the inner edges of the mask defining the feature being produced. A deposition material is deposited over the exposed seedlayer, and the mask is removed. Unwanted portions of the seedlayer and deposition layer are removed by mechanically lifting off. The adhesion inhibitor serves to inhibit the bonding of the seedlayer to the substrate sufficiently to enable the mechanical lift-off. The adhesion inhibitor is removed, either by lifting off with the seedlayer and deposition layer, or subsequently.

11 Claims, 15 Drawing Figures

DEPOSITION PROCESS

This invention relates to a deposition process for producing a desired feature on a substrate, and particularly to a deposition process, using additive plating techniques, for forming thin film magnetic recording heads. The invention is particularly useful for the deposition of full wafers, rather than individual small islands of pattern features. Full wafer deposition is particularly advantageous because density, composition and plating rates are more easily controlled in full wafer deposition than in deposition of isolated pattern islands.

Heretofore, deposition processes for forming thin film magnetic recording heads have employed the additive plating of the various layers of the thin film head, coupled with etching away and chemical removal of all undesired features, thereby leaving the desired features. Ordinarily, during the chemical etching of the undesirable features, a mask or other shield is employed to protect the desired features from the etchant. However, if the mask or other protective shield does not adequately protect the desired features, the etchant can attack the desired features causing "rat-bites" or other flaws in the desired feature. Also, inadequate curing of the cap or mask prior to the etchant process, can create flaws in the cap or mask making the desired features subject to attack during the etching process.

Examples of prior techniques in connection with deposition processes may be found in U.S. Pat. Nos. 4,224,361 to Romankiw, 4,238,559 to Feng et al, 4,256,816 to Dunkleberger, and in IBM Technical Bulletin "Masking Process for Magnetic Head Manufacture" by Decker and Erez, Volume 22, No. 9, Page 4167.

It is an object of the present invention to provide a deposition process for forming a desired feature of deposition material on a substrate wherein undesired features are lifted away in a lift-off process without the use of a chemical etchant.

In accordance with the present invention, a desired feature is produced on a substrate by forming an adhesion inhibitor onto a portion of the substrate in a pattern whose inner edges are adjacent to the bounds of the feature being produced. A first layer or seedlayer of deposition material is deposited onto the adhesion inhibitor and the exposed portions of the substrate, and a pattern of photoresist is formed on the seedlayer, the photoresist covering the seedlayer adjacent the edges of the adhesion inhibitor. The inner edges of the photoresist define the bounds of the feature being produced. A second layer of deposition material is formed on the exposed portions of the seedlayer and the photoresist is thereafter removed. Thereupon, the adhesion inhibitor and undesired portions of the first and second layers are mechanically removed. The adhesion inhibitor serves to inhibit the bonding of the seedlayer to the substrate sufficently to enable mechanical lift-off of the seedlayer from the substrate. In one form of the invention, the adhesion inhibitor and undesired portions of the first and second deposition layers are removed by mechanically lifting off the three layers from the substrate. In a second form of the invention the adhesion inhibitor remains on the substrate and the undesired portions of the deposition layer are removed by mechanically lifting off the two deposition layers. In either case, the first layer of deposition material is severed at the edges of the adhesion inhibitor during the lift off process.

According to one feature of the present invention, a third layer of deposition material is formed over the exposed portions of the first and second layers of the desired feature by forming a second layer of adhesion inhibitor over the exposed portions of the substrate and depositing the third layer of deposition material over the desired features and the adhesion inhibitor. Thereafter, the adhesion inhibitor and undesired portions of the third layer are mechanically removed, as heretofore described.

One feature of the present invention resides in the fact that etchants and other chemical materials ordinarily used for removing deposition material are not employed in the present process. Hence, there is no danger that the desired features will be etched by an etchant.

Another feature of the present invention resides in the fact that no protective cap or other shield is required to protect the desired features during an etching process.

The above and other features of this invention will be more fully understood from the following detailed description, and the accompanying drawings, in which.

Figure 1A:
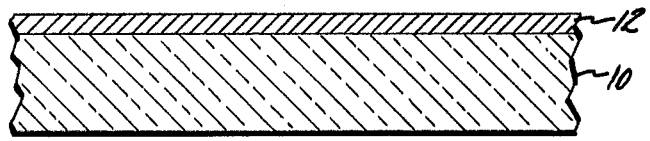
FIGS. 1A–1F illustrate the steps in a deposition process in accordance with techniques employed in the prior art.
Figure 1B:
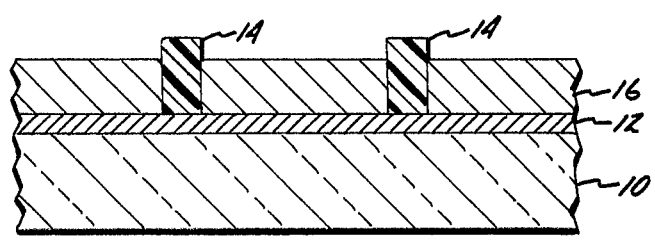
Figure 1C:
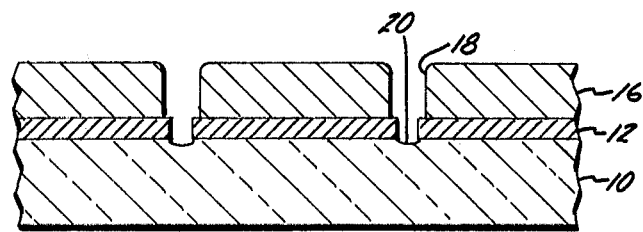
Figure 1D:
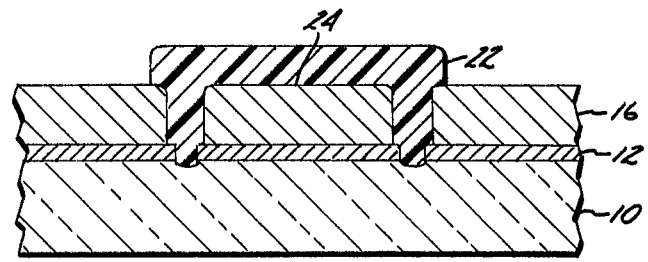
Figure 1E:
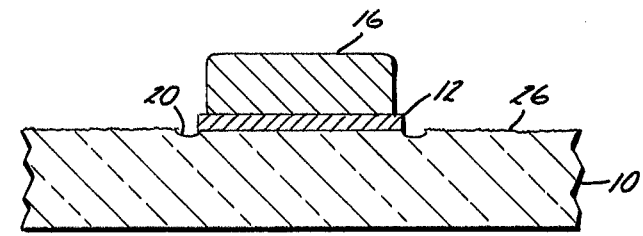

Referring to the drawings, and particularly FIGS. 1A through 1F, there is illustrated the steps of a deposition process as practiced in the prior art. The process illustrated in FIGS. 1A through 1F is, essentially, the process described in the aforementioned Romankiw patent. The prior art technique employed a substrate 10, constructed of a suitable insulative or nonconductive material, onto which seedlayer 12 was deposited to provide a suitable adherent base for the material yet to be deposited. A photoresist mask 14 was formed over the surface of seedlayer 12 and was exposed and washed away in the usual manner to leave a suitable pattern of photoresist material (FIG. 1B). The material to be ultimately deposited was deposited onto the exposed surfaces seedlayer 12 to thereby form a layer 16 of material. For example, in the formation of a magnetic object, such as a thin film head for use in data processing equipment, seedlayer 12 and layer 16 would be suitable ferromagnetic materials, such as a ferrous-nickel alloy. Upon completion of the deposition of layer 16, the remaining portions of photoresist mask 14 were exposed and washed away, thereby leaving apertures 18 in layer 16 (FIG. 1C). Thereafter, exposed seedlayer in apertures 18 was removed by sputter-etching or ion milling through seedlayer 12 and a short distance into substrate 10, as illustrated at reference numeral 20. Thereafter, a suitable photoresist cap 22 was applied over the region 24 of layer 16 and in the apertures 18, 20 formed by removal of photoresist 14 and the etching through seedlayer 12 (FIG. 1D). The exposed portions of layer 16 and seedlayer 12 were thereafter chemically etched, for example with ferric-chloride acid, and photoresist 22 was exposed and removed, thereby leaving the product as illustrated in FIG. 1E.

Figure 1F:
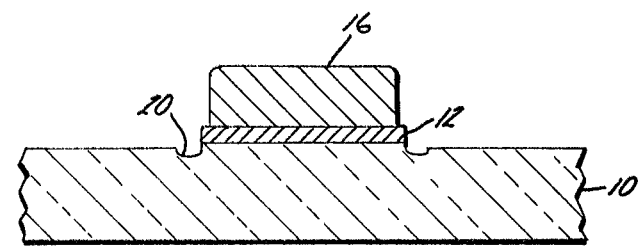

Most metals do not adhere well to insulative substrates. For example, it is difficult to achieve a good bond of copper onto ceramic or silicon dioxide substrates. But other metals do bond well to insulative substrates. For example, nickel, iron and ferrous-nickel alloys do bond well to ceramic and silicon dioxide substrates. Although the reasons for this phenomenon is not fully known, it is theorized that certain metals (nickel and iron, for example) react with oxygen in the substrate at the interface therewith to form a thin layer (50 Å, for example) of metal oxide which bonds well to the substrate. Pure metal or metal alloy will then bond well to the metal oxide. Thus, in depositing seedlayer 12 in the prior art process, the ferrous-nickel alloy deposited actually formed a thin layer of ferrous and nickel oxide to which the remainder of the alloy was bonded. One problem, however, is that when the ferrous-nickel alloy was etched away (going from FIG. 1D to FIG. 1E), the etchant did not remove the metal oxide on the surface of the substrate, so the metal oxide was left as a residue, shown at reference numeral 26. Therefore, it was necessary to remove excess residue 26 by a mechanical scrubbing, such as ion milling, sputtering, sodium bicarbonate scrubbing or other suitable anisotropic process. The completed device made by the prior process is shown in FIG. 1F.

Among the problems with the process illustrated in FIGS. 1A–1F is the formation of "rat-bites" which are failures, fractures or ruptures in the completed product caused by chemical etchant attacking the desired portions of layer 16 or seedlayer 12 due to the inability of the photoresist cap 22 to adequately protect the desired features of the product. Furthermore, abrasives used in the scrubbing process may create ruptures in the desired seedlayer or layer 16, or (worse yet) abrasive residue may be left to contaminate the final product. Also, the prior process required post-baking of cap 22 before etching layer 16 to avoid removal of the desired portions while etching undesired portions of layer 16 and seedlayer 12. Inadequate curing or baking of the cap caused failure of the cap, thereby allowing the etchant to attack the desired features. Thus, inadequate curing of cap 22 led to the formation of "rat-bites," as described above. Also, the sputter-etching of the seedlayer as shown in FIG. 1C tends to etch away a similar amount of desired features. The present invention eliminates the aforementioned disadvantages of the prior art by eliminating the necessity for etching the seedlayer, eliminating the need for a scrubbing step, and eliminating the need to post-bake the photoresist cap during chemical etch. Also, the formation of undesired metal oxides in the regions outside the product being formed is eliminated.

Figure 2A:
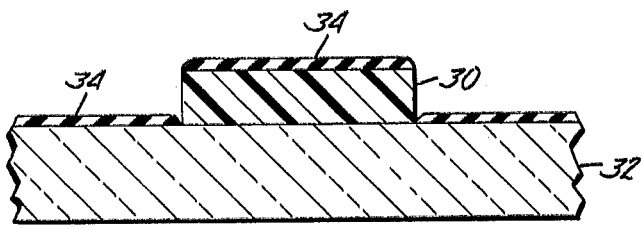
FIGS. 2A–2E illustrate the steps of a deposition process in accordance with the presently preferred embodiment of the present invention.
Figure 2B:
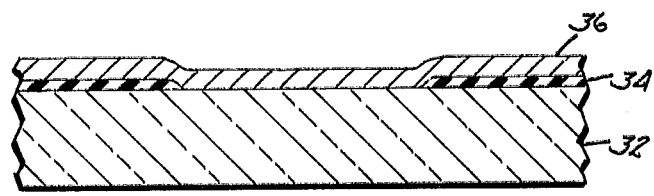
Figure 2C:
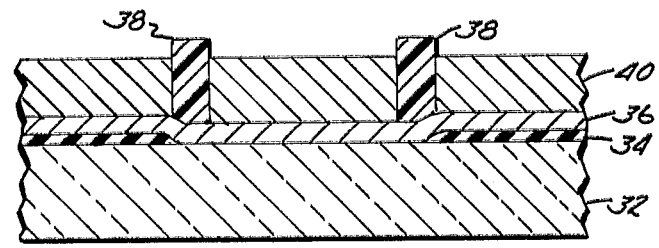
Figure 2D:
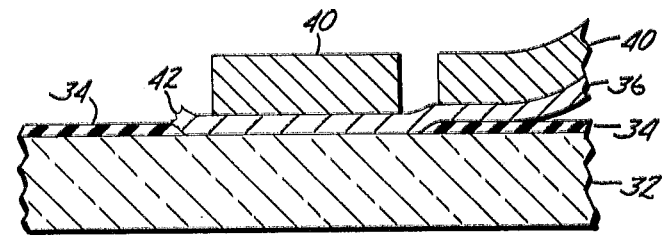
Figure 2E:
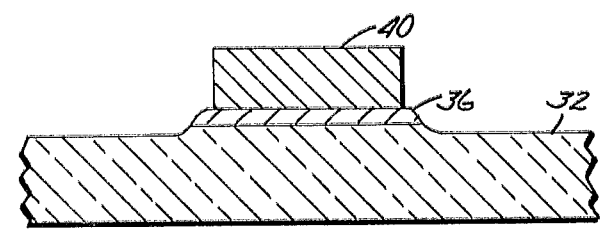
Figure 3A:
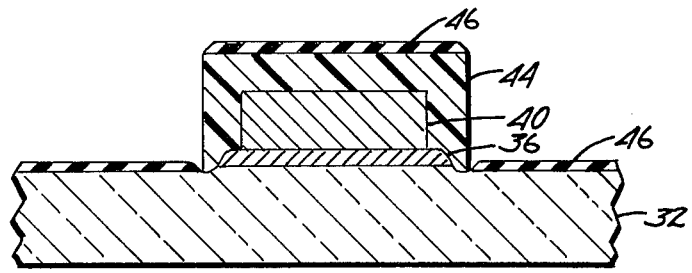
FIGS. 3A–3D illustrate a modification of the deposition process illustrated in FIGS. 2A–2E.
Figure 3B:
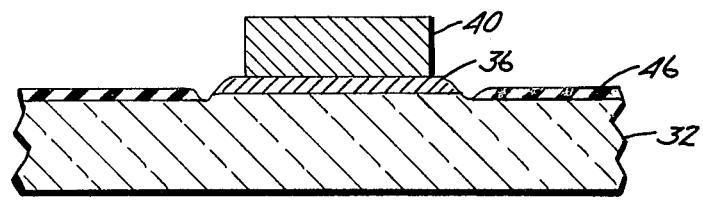
Figure 3C:
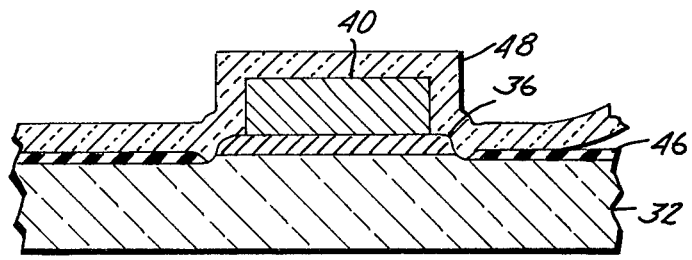
Figure 3D:
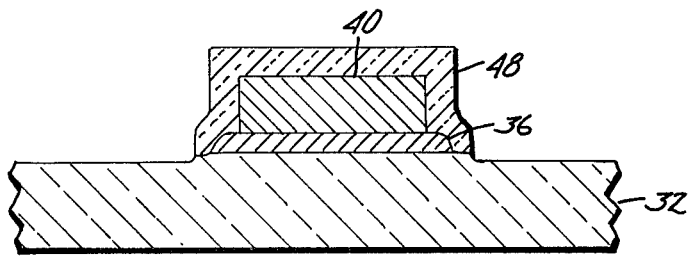

FIGS. 2A–2E illustrate the deposition process in accordance with the presently preferred embodiment of the present invention. As illustrated in FIG. 2A, a photoresist mask 30, having desired features, is formed onto a surface substrate 32. Substrate 32 is constructed of a suitable nonmagnetic, nonconductive material, such as ceramic or silicon dioxide. One convenient way to form the mask is by coating the entire surface of substrate 32 with a positive photoresist, and expose, develop and dissolve the portions of the photoresist layers which are not desired, thereby leaving the resulting photoresist mask 30 illustrated in FIG. 2A. The remaining mask, which at least encompasses the pattern of the intended final product, is then exposed, but not dissolved. A thin adhesion inhibitor layer 34, such as silicon monoxide (SiO), is deposited (such as by a vapor deposition process) onto the exposed surface of substrate 32 and onto the upper surface of mask 30. Importantly, inhibitor layer 34 is not deposited on to the sides of mask 30, so a pinpoint or parallel flow source of deposition is used to deposit layer 34. Otherwise, mask 30 should be constructed so as to maintain its side edges free from exposure to the inhibitor being deposited. Mask 30 is then dissolved, carrying away the adhesion inhibitor deposited to the upper surface thereof. Seedlayer 36, comprising a suitable ferromagnetic material, such as a ferrous-nickel alloy, is then deposited (such as by a vacuum sputter deposition process) onto the upper surface of adhesion inhibitor 34 and the exposed portions of substrate 32 as illustrated in FIG. 2B. Typically, the seedlayer will be thicker than the adhesion inhibitor (layer, seedlayer 36 being of the order of 400 to 1000 Å whereas inhibitor layer 34 is of the order of 300 to 500 Å. A second photoresist mask 38 is formed on the surface of seedlayer 36 in juxtaposition to the edges of adhesion inhibitor layer 34 as formed by photoresist mask 30 in the step illustrated in FIG. 2A. Mask 38 precisely defines the size and shape of the product being formed. Ferromagnetic layer 40 is thereupon deposited or plated onto the exposed portions of seedlayer 36 as illustrated in FIG. 2C. Layer 40, which may be a ferrous-nickel alloy, may be deposited to a thickness of 2 to 4 microns, as desired. Layer 40 will ultimately form one pole piece for a thin film magnetic head. Photoresist mask 38 is thereupon removed in the usual manner by exposure and acetone solvent, and those portions of layer 40 and seedlayer 36 above adhesion inhibitor layer 34 may be removed mechanically as shown in FIG. 2D. Excess seedlayer 36, together with excess layer 40 bonded thereto, may be simply peeled away from inhibitor layer 34. Conveniently, adhesive tape, ultrasonic agitation, fluid jetstreams, or other suitable mechanical technique may be used to assist in the removal of excess seedlayer 36 and layer 40. Seedlayer 36 is broken as illustrated at reference numeral 42 adjacent the edges of adhesion layer 34.

The ferrous-nickel seedlayer, of course, bonds well to substrate 32 in the region adjacent the desired features of layer 40. This is probably the result of the formation of a thin layer of oxidized metal at the interface, as heretofore explained. Also, the silicon monoxide inhibitor layer 34 bonds well to the substrate (which is silicon dioxide or ceramic). However, silicon monoxide does not easily give up oxygen atoms to the adjacent metal in seedlayer 36. Therefore, the inhibitor layer 34 forms a barrier against migration of oxygen from the substrate to the seedlayer, and does not bond well to seedlayer 34. Thus, seedlayer 36 may be easily peeled from inhibitor layer 34, as shown. Further, since seedlayer 36 is relatively thin (400 to 1000 Å), is not backed by the thickness of layer 40 in the apertures left by the removal of photoresist 38, and is well bonded to the substrate, seedlayer will fracture at 42 adjacent the edges of inhibitor layer 34 because that is the region of weakest strength of the seedlayer.

In actual practice, several thin film head pieces may be fabricated from a single wafer simultaneously, so with the present invention it is possible to lift off and strip the excess seedlayer and layer 40 from all patterns on the wafer in a single operation. Also, in actual practice, and although not shown in the drawing, a small amount of inhibitor material from layer 34 may be stripped away with the excess seedlayer 36. Although it might be desirable to employ an inhibitor layer 34 which bonds well to the seedlayer, but not the substrate, so the inhibitor layer may be lifted off with the excess seedlayer, in reality there is little economic incentive for this since the completed product must be cleaned anyway. A copper inhibitor layer might be employed in this regard to bond to the seedlayer and be lifted off from the substrate with the seedlayer, but the results achieved using copper inhibitors have not been as good as achieved using the process as described, and the economic concerns indicate the use of a silicon monoxide inhibitor as the more desirable approach.

Excess seedlayer 36, from the edge left by severing or breaking at 42, and the undesired adhesion inhibitor may be removed by a suitable backsputtering or ion milling process. Since the adhesion inhibitor layer is thinner than the seedlayer and since the two have similar mill rates, excess seedlayer may be removed concurrent with the adhesion inhibitor layer to form the completed product shown in FIG. 2E.

FIGS. 3A through 3D illustrate a technique for applying another layer over the material 40 in the final product. For example, the process illustrated in FIGS. 3A through 3D is useful for forming a suitable gap material onto the surface of a ferromagnetic pole piece 40 illustrated in FIG. 2E. Starting with the product illustrated in FIG. 2E, a photoresist cap 44 is formed over the essential portions of the product and a second adhesion inhibitor layer 46 (e.g. silicon monoxide) is formed, as described in connection with FIG. 2A. The photoresist cap is then removed, thereby exposing pole piece 40. See FIG. 3B. Nonmagnetic gap material consisting of a layer 48 is thereupon deposited (such as by a vacuum deposition process) over the exposed portions of pole piece 40, seedlayer 36, substrate 32, and adhesion inhibitor 46. Layer 48 may comprise aluminum oxide ($Al_2O_3$) with a thickness of about 5000 to 8000 Å. Unwanted portions of the layer 48 are thereafter removed mechanically by lifting off layer 48 as described in connection with FIG. 2D. See FIG. 3C. The product may thereupon be mechanically finished as described in connection with FIG. 2E to complete the product shown in FIG. 3D.

The present invention thus provides a process for forming thin film metallic patterns onto insulative substrates without the need to etch away unwanted portions. Although the process is described in association with ferrous-nickel alloys, as may be useful in forming thin film recording heads for data processing purposes, the invention is equally applicable to other metals as well. The first and second layers of deposition materials may be similar or dissimilar metals. Also, although the invention has been described using metals and metal alloys which bond well to the insulative substrates, the process is also applicable to deposit of metals which do not bond well to insulative substrates. For example, if instead of ferous-nickel alloy, one wished to deposit copper, the seedlayer 36 would include titanium and/or chromium underlayer interface with the substrate with a copper overlayer thereon.

The invention is not to be limited by the embodiment shown in the drawings and described in the description, which are given by way of example and not of limitation, but only in accordance with the scope of the appended claims.

What is claimed is:

1. A deposition process for producing a desired feature of deposition material comprising the steps of
    a. forming a layer of adhesion inhibitor onto a portion of the surface of a substrate in a pattern whose inner edges are adjacent the bounds of the feature being produced, said adhesion inhibitor serving to inhibit the bonding to the substrate surface of deposition material to be subsequently deposited on said adhesion inhibitor, thereby permitting mechanical lift-off of a layer of said deposition material from said substrate surface;
    b. depositing a first layer of deposition material onto the layer of adhesion inhibitor and the exposed portions of said substrate;
    c. forming a pattern of photoresist on said first layer of deposition material adjacent said inner edges of said adhesion inhibitor layer, the inner edges of said pattern defining the bounds of said feature being produced;
    d. depositing a second layer of deposition material onto the exposed portions of said first layer of deposition material;
    e. removing said pattern of photoresist; and
    f. removing said adhesion inhibitor, that portion of said second layer of deposition material not part of the feature being produced, and that portion of said first layer of deposition material over said adhesion inhibitor, at least said portions of said first and second layers of deposition material being removed by mechanically lifting off and breaking or severing said first layer of deposition material adjacent said inner edges of said adhesion inhibitor.

2. The process according to claim 1 wherein said adhesion inhibitor, the deposition material comprising said first layer, and said substrate are so selected that said adhesion inhibitor adheres better to said first layer than to said substrate, and said adhesion inhibitor is removed from said substrate by mechanically lifting off with said portions of said first and second layers of deposition material.

3. The process according to claim 1 wherein said adhesion inhibitor, the deposition material comprising said first layer, and said substrate are so selected that said adhesion inhibitor adheres better to said substrate than to said first layer, and said portions of said first and second layers of deposition material are removed by mechanically lifting off from said adhesion inhibitor, and said adhesion inhibitor is removed subsequently.

4. The process according to claim 3 wherein said substrate is an insulative material, said first and second layers of deposition material are ferrous-nickel alloys and said adhesion inhibitor is silicon oxide.

5. The process according to claim 3 further including forming a second layer of adhesion inhibitor over the exposed portions of said substrate, depositing a third layer of deposition material over the exposed portions of said first and second layers of deposition material and said second layer of adhesion inhibitor and removing said second layer of adhesion inhibitor and that portion of said third layer of deposition material over said second layer of adhesion inhibitor, at least said portion of said third deposition layer being removed by mechanically lifting off and breaking or severing said third deposition layer adjacent the inner edges of said second layer of adhesion inhibitor.

6. The process according to claim 5 wherein said substrate is an insulative material, said first and second layers of deposition material are ferrous-nickel alloys and said adhesion inhibitor is silicon oxide.

7. The process according to claim 6 wherein said third layer of deposition material is $Al_2O_3$.

8. The process according to claim 1 wherein said substrate is an insulative material and said first and second layers of deposition material are similar metals.

9. The process according to claim 8 wherein said first and second layers of deposition material are ferrous-nickel alloys and said adhesion inhibitor is silicon monoxide.

10. The process according to claim 1 wherein said substrate is an insulative material and said first and second layers of deposition materials are dissimilar metals.

11. The process according to claim 1 further including forming a second layer of adhesion inhibitor over the exposed portions of said substrate, depositing a third layer of deposition material over the exposed portions of said first and second layers of deposition material and said second layer of adhesion inhibitor and removing said second layer of adhesion inhibitor and that portion of said third layer of deposition material over said second layer of adhesion inhibitor, at least said portion of said third deposition layer being removed by mechanically lifting off and breaking or severing said third deposition layer adjacent the inner edges of said second layer of adhesion inhibitor.

* * * * *